United States Patent
Karakulak et al.

(10) Patent No.: US 9,343,170 B2
(45) Date of Patent: May 17, 2016

(54) WORD-LINE INTER-CELL INTERFERENCE DETECTOR IN FLASH SYSTEM

(71) Applicant: HGST Netherlands B.V., Amsterdam (NL)

(72) Inventors: Seyhan Karakulak, San Diego, CA (US); Anthony Dwayne Weathers, San Diego, CA (US); Richard David Barndt, San Diego, CA (US)

(73) Assignee: HGST Technologies Santa Ana, Inc., Santa Ana, CA (US)

( * ) Notice: Subject to any disclaimer, the term of this patent is extended or adjusted under 35 U.S.C. 154(b) by 1 day.

(21) Appl. No.: 14/313,971

(22) Filed: Jun. 24, 2014

(65) Prior Publication Data

US 2015/0371714 A1    Dec. 24, 2015

(51) Int. Cl.
*G11C 16/04*    (2006.01)
*G11C 16/34*    (2006.01)
*G11C 16/26*    (2006.01)

(52) U.S. Cl.
CPC ............ *G11C 16/3427* (2013.01); *G11C 16/26* (2013.01); *G11C 16/3418* (2013.01); *G11C 16/3431* (2013.01); *G11C 16/04* (2013.01)

(58) Field of Classification Search
CPC .................................................. G11C 16/3427
USPC ...................................................... 365/185.02
See application file for complete search history.

(56) References Cited

U.S. PATENT DOCUMENTS

| | | | |
|---|---|---|---|
| 7,898,863 B2 | 3/2011 | Aritome | |
| 8,085,605 B2 | 12/2011 | Yang et al. | |
| 8,139,417 B2 * | 3/2012 | Kim | G11C 16/04 365/185.17 |
| 8,462,549 B2 | 6/2013 | Haratsch et al. | |
| 8,493,791 B2 * | 7/2013 | Karakulak | G11C 16/3431 365/185.02 |
| 8,958,243 B2 * | 2/2015 | Zeng | G11C 16/3427 365/185.02 |
| 2010/0208519 A1 * | 8/2010 | Shiga | G11C 11/5642 365/185.03 |
| 2013/0163328 A1 | 6/2013 | Karakulak et al. | |
| 2013/0176779 A1 | 7/2013 | Chen et al. | |

OTHER PUBLICATIONS

A. Berman, et al., "Low-Complexity Two-Dimensional Data Encoding for Memory Inter-Cell Interference Reduction," IEEE Xplore, Nov. 2012, pp. 1-5.

M. Jeon, et al., "Adaptive Interference Mitigation for Multilevel Flash Memory Devices," IEICE Transactions on Fundamentals of Electronics, Communications and Computer Sciences, Nov. 1, 2011, pp. 2453-2457, vol. E94-A, No. 11.

Q. Li, "WOM Codes Aginst Inter-Cell Interference in NAND Memories," IEEE, Sep. 2011, pp. 1416-1423.

* cited by examiner

*Primary Examiner* — Son Mai
(74) *Attorney, Agent, or Firm* — McDermott Will & Emery LLP

(57) ABSTRACT

Read signals are obtained from memory cells, and a first read signal and a second read signal are identified, from among the plurality of read signals. The first read signal is associated with a first memory cell in a first word line and the second read signal is associated with a second memory cell in a second word line, and the second word line is adjacent to the first word line. An output for the first memory cell is generated, wherein the output is based on the first and the second read signals.

20 Claims, 14 Drawing Sheets

| L1 Distribution | % Change in the Mean | % Change in the Variance |
|---|---|---|
| Left cell is programmed at L3 | 8.13% | 33.04% |
| Right cell is programmed at L3 | 9.67% | 28.04% |
| Both left and right cells are programmed at L3 | 18.78% | 0.37% |

FIG. 6

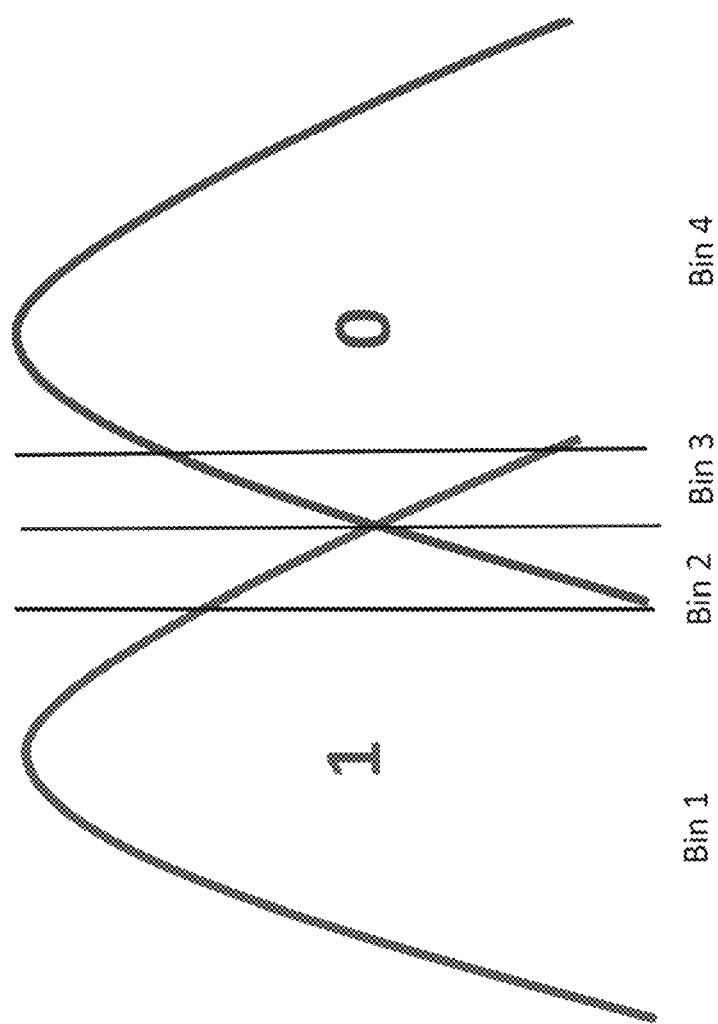

WORD-LINE INTER-CELL INTERFERENCE DETECTOR IN FLASH SYSTEM

This application is related to U.S. application Ser. No. 13/725,689, filed Dec. 21, 2012, now U.S. Pat. No. 8,493,791, entitled "WORD-LINE INTER-CELL INTERFERENCE DETECTOR IN FLASH SYSTEM," which is incorporated herein by reference.

BACKGROUND

The present disclosure relates to the retrieval of information from flash memory devices, such as solid-state drives (SSDs).

SUMMARY

The subject technology relates to a method for retrieving information stored in flash memory. According to various aspects, the method may include obtaining a plurality of read signals from a plurality of memory cells, identifying, from among the plurality of read signals, a first read signal associated with a first memory cell in a first word line and a second read signal associated with a second memory cell in a second word line, wherein the second word line is adjacent to the first word line, and generating an output for the first memory cell, wherein the output is based on the first and the second read signals. Other aspects include corresponding systems, apparatuses, and computer program products for implementation of the computer-implemented method.

According to various aspects, a data storage system may include a configuration memory, a plurality of memory cells, and a controller coupled to the configuration memory and the plurality of memory cells. The controller may be configured to obtain a plurality of read signals from the plurality of memory cells identify, from among the plurality of read signals, a first read signal associated with a first memory cell in a first word line and a second read signal associated with a second memory cell in a second word line, wherein the second word line is adjacent to the first word line, and generate an output for the first memory cell, wherein the output is based on the first and the second read signals.

According to further aspects, a computer program product tangibly embodied in a computer-readable storage device may comprise instructions that, when executed by a memory controller, cause the memory controller to obtain a plurality of read signals from a plurality of memory cells, identify, from among the plurality of read signals, a first read signal associated with a first memory cell in a first word line, a second read signal associated with a second memory cell in a second word line, and a third read signal associated with a third memory cell, the third memory cell being in the first word line and adjacent to the first memory cell, the second memory cell being in the same bit line as the first memory cell, and the second word line is adjacent to the first word line, and generate an output for the first memory cell, wherein the output is based on the first and the second and third read signals.

According to various aspects described herein, the output may be generated based on a trellis-based algorithm. The method and system and computer program product may further operate to retrieve one or more input values from one or more lookup tables based on an indexing of the one or more lookup tables by a first value corresponding to the first read signal and a second value corresponding to the second read signal, and provide the one or more input values to the trellis-based algorithm, wherein the output is based on the provided input values, wherein the trellis-based algorithm references a trellis comprising a plurality of state transitions, each state transition representative of a transition of memory cell output values that are read sequentially along a word line, and each transition being associated with a respective one of the input values.

It is understood that other configurations of the present disclosure will become readily apparent to those skilled in the art from the following detailed description, wherein various configurations of the present disclosure are shown and described by way of illustration. As will be realized, the present disclosure is capable of other and different configurations and its several details are capable of modification in various other respects, all without departing from the scope of the present disclosure. Accordingly, the drawings and detailed description are to be regarded as illustrative in nature and not as restrictive.

BRIEF DESCRIPTION OF THE DRAWINGS

FIG. 6 depicts example percentage changes in the means and variances of certain example probability density distribution curves based on cell data levels of adjacent cells.

FIG. 10 depicts example memory cell distributions and memory cell bin locations related to reading an example SIX memory cell.

DETAILED DESCRIPTION

The detailed description set forth below is intended as a description of various configurations of the present disclosure and is not intended to represent the only configurations in which the present disclosure may be practiced. The appended drawings are incorporated herein and constitute a part of the detailed description. The detailed description includes specific details for the purpose of providing a thorough understanding of the present disclosure. However, it will be apparent to those skilled in the art that the present disclosure may be practiced without these specific details. In some instances, structures and components are shown in block diagram form in order to avoid obscuring the concepts of the present disclosure. Like components are labeled with identical element numbers for ease of understanding.

In flash memory devices, the threshold voltage level of a cell may be increased when the neighboring cells are programmed. An increase in the threshold voltage level of a cell due to programming its neighbors is called inter-cell interference (ICI). The impact of ICI is pattern dependent and depends on the flash device operating conditions, such as endurance cycles, retention, and the ambient temperature for programming and reading the flash device. Further, ICI depends on the number of bits programmed per cell and the density of the cells. With the continuing demands for smaller flash devices, ICI is expected to increase substantially. Such increase in ICI could substantially degrade a flash system's performance if its effect is not mitigated in detection and decoding steps.

The present disclosure provides a flash system with a multi-directional ICI detector that takes into account ICI arising from adjacent cells, in both the word line and in the bit line directions. The multi-directional ICI detector of the subject technology may receive hard or soft inputs, and generate hard or soft outputs. Algorithms such as maximum a posteriori (MAP) algorithm, soft output Viterbi algorithm (SOVA), or Max-log-MAP and the Viterbi algorithm may be utilized in the detector to generate soft or hard outputs based on inter-cell interference data. The outputs of the detector are then fed to a decoder. Since the effect of ICI is mitigated by the multi-directional ICI detector, the performance of the decoder may be enhanced. In the presence of constrained codes, the multi-directional ICI detector may consider the constraints in the detection process.

The multi-directional ICI detector may utilize a model based on training data and a MAP algorithm. Detection performance utilizing a multi-directional ICI detector is significantly better than detection performance of a traditional threshold detector that does not consider the effect of multi-directional ICI. In addition, detection performance utilizing a multi-directional ICI detector are further increased where there are offsets from the expected threshold levels.

Figure 1:
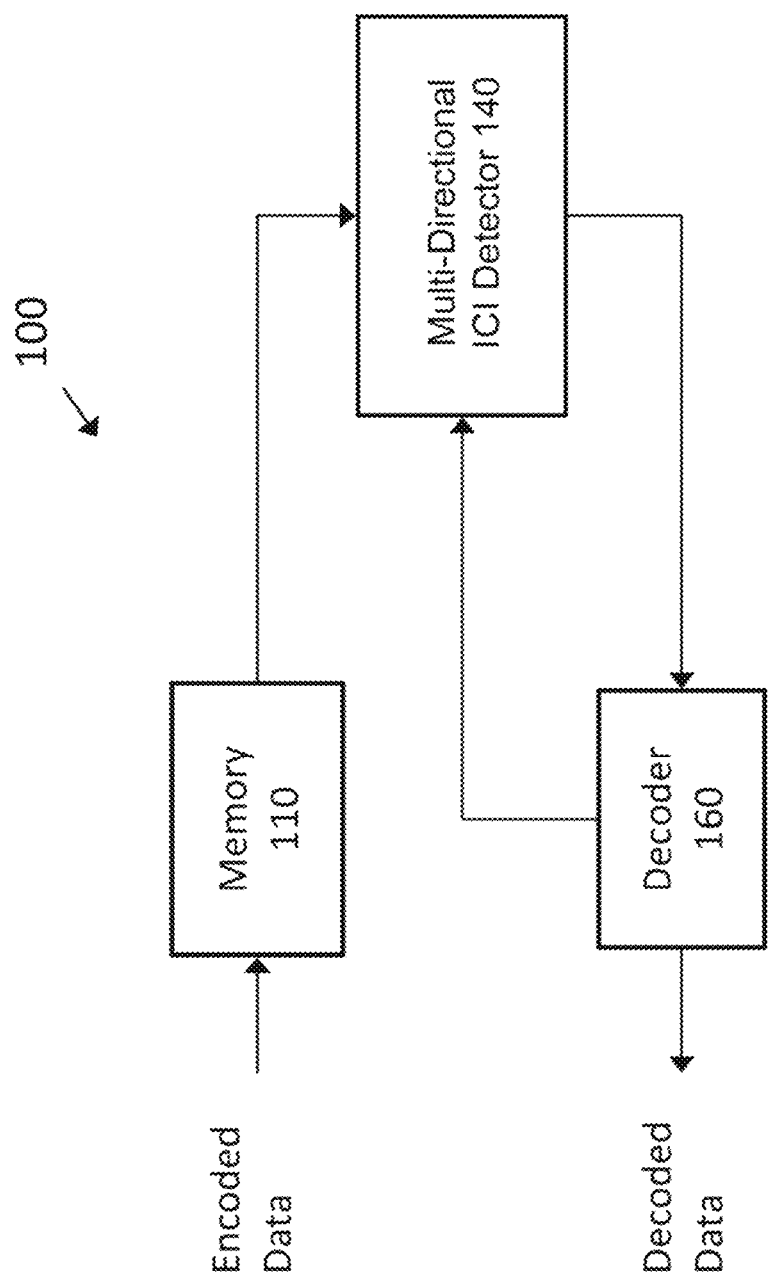
FIG. 1 is a block diagram depicting an example system for decoding information stored on a flash memory device using a multi-directional ICI detector.

FIG. 1 is a block diagram depicting an example system 100 for decoding information stored on a flash memory device using a multi-directional ICI detector 140 in accordance with one or more implementations of the subject technology. In the depicted example, multi-directional ICI detector 140 receives flash output data from flash memory 110 by means of one or multiple reads, and generates soft information that may be used by a decoder 160. Decoder 160 may then generate new soft information and return the information back to multi-directional ICI detector 140 to be used by detector 140 in further generating soft information.

ICI arising from adjacent cells is considered by system 100 during a detection step. Encoded data may be written to flash memory 110 in a known manner, and subsequently read from flash memory 110 by means of one read or multiple reads. The flash output data produced by flash memory 110 may include hard decisions based on cell data levels obtained from one read, or soft information obtained from multiple reads. Outputs with soft information typically have more reliable information. However, the number of additional reads required for generating soft information may introduce delays and require extra storage.

The flash output data is input to multi-directional ICI detector 140. In some implementations, decoder 160 generates soft information based on output information received from multi-directional ICI detector 140, and then feeds the information back to multi-directional ICI detector 140 in, for example, an iterative manner. An iterative feedback process may continue until the flash output data is successfully decoded by decoder 160 or a maximum number of iterations is reached. In certain aspects (e.g., in the presence of constrained codes), multi-directional ICI detector 140 may consider certain constraints in the detection process. Additionally or in the alternative, multi-directional ICI detector 140 and decoder 160 may process hard decisions inputs.

Multi-directional ICI detector 140 may include a trellis-based detection algorithm to generate soft information for decoder 160. Additionally or in the alternative, multi-directional ICI detector 140 may include a sequence detector such as a decision feedback equalizer (DFE) and a fixed-depth delay tree-search with DFE. Soft information generated by multi-directional ICI detector 140 may be in the form of log-likelihood ratios (LLRs), a posteriori probabilities (APPs), or approximation of LLRs or APPs. Several different algorithms may be utilized by multi-directional ICI detector 140 depending on the input and output types. For example, if APPs are required as an output, a BCJR (Bahl, Cocke, Jelinek and Raviv) algorithm that utilizes forward and backward state metrics with state transition metrics may be used. For the BCJR algorithm, the whole sequence on a word line or a partial word line may be required to be retrieved due to its forward and backward recursive computations. Complex arithmetic operations such as the BCJR algorithm require complex hardware implementations. Therefore, to eliminate delay and the necessity of complex hardware implementations, algorithms that approximate the APPs may be used. For example, sliding window implementations of the BCJR algorithm may be used. In the sliding window implementation, the approximate APP of each level at a given time or location may be obtained by considering a finite length of forward and backward signals, which reduces a possible delay. To further reduce hardware complexity, algorithms such as the Max-Log-MAP algorithm (which may approximate and/or simplify probability calculations), may also be implemented.

Other low-complexity methods that approximate the APPs utilize Viterbi type detection algorithms. For example, the soft-output Viterbi algorithm (SOVA) and the modified SOVA algorithm have considerably less detection complexity as compared to the BCJR algorithm. In some implementations, LLRs may be obtained from APPs or from approximate APPs and a hard decision may be made on the APPs with a decision rule that minimizes the symbol error rate (SER). For hard decisions, a symbol sequence detection algorithm, such as the Viterbi algorithm, which outputs the maximum-likelihood (ML) sequence, may be utilized.

Figure 2:
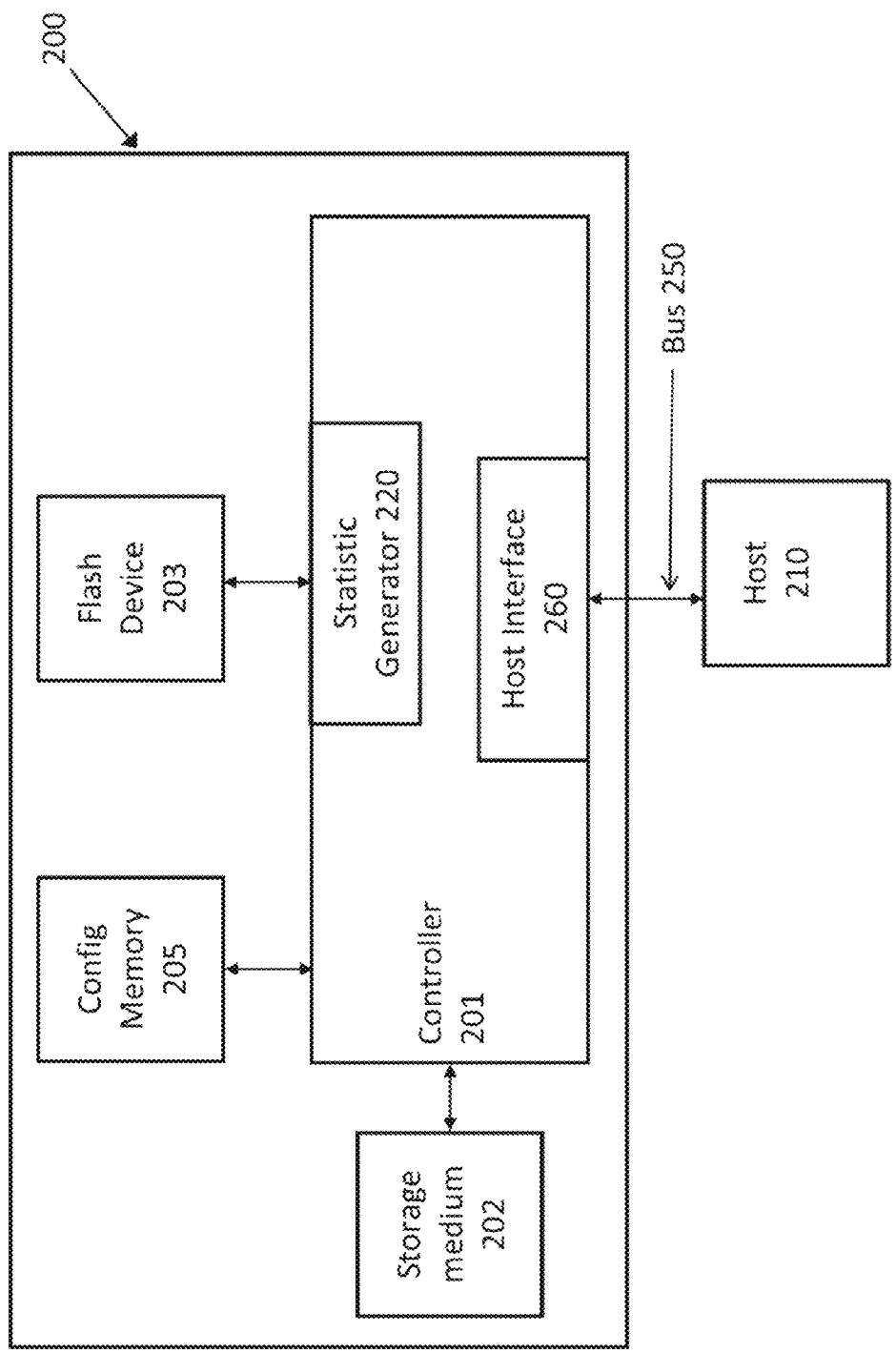
FIG. 2 is a block diagram depicting example components of an example data storage system.

FIG. 2 is a block diagram depicting components of an example data storage system 200 (for example, a solid state drive) in accordance with one or more implementations of the subject technology. Data storage system 200 may include a data storage controller 201, storage medium 202, configuration memory 205, and flash device 203. Controller 201 may use storage medium 202 for temporary storage of data and information used to manage data storage system 200. Controller 201 may include several internal components (not shown) such as one or more processors, a read-only memory, a flash component interface (for example, a multiplexer to manage instruction and data transport along a serial connection to flash device 203), an I/O interface, error correction circuitry, and the like. In some aspects, one or more elements of controller 201 may be integrated into a single chip. In other aspects, the elements may be implemented on two or more discrete components.

Controller 201, or one or more components therein, may be configured to execute code or instructions to perform the operations and functionality described herein. For example, controller 201 may be configured to perform operations for managing request flow and address mappings, and to perform calculations and generate commands. The processor of controller 201 may be to monitor and control the operation of the components in data storage controller 201. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 201 and/or its processor. One or more sequences of instructions may be software stored and read from storage medium 202, flash device 203, or received from host device 210 (for example, via a host interface). ROM, storage medium 202, flash device 203, represent examples of machine or computer readable media on which instructions/code executable by controller 201 and/or its processor may be stored. Machine or computer readable media may generally refer to any tangible and/or non-transitory medium or media used to provide instructions to controller 201 and/or its processor, including both volatile media, such as dynamic memory used for storage media 202 or for buffers within controller 201, and non-volatile media, such as electronic media, optical media, and magnetic media.

In some aspects, controller 201 is configured to store data received from host device 210 in flash device 203 in response to a write command from host device 210. Controller 201 is further configured to read data stored in flash memory 203 and to transfer the read data to host device 210 in response to a read command from host device 210. As will be described in more detail below, controller 201 is configured to generate inter-cell interference statistics based on training data and to generate an ICI detector output for the decoder based on the read signals and the inter-cell interference statistics. In some implementations, inter-cell interference statistics are pre-generated and made available to the data storage system 200 by various methods, via an external memory, for example. By taking into account the inter-cell interference statistics, and in particular the inter-cell interference in the word line and/or bit line direction(s), the present disclosure improves SSD performance and reduces error rates compared to performance of SSD using flash memory cells in the same application environment without multi-directional ICI detection.

Host device 210 represents any device configured to be coupled to data storage system 200 and to store data in data storage system 200. I-lost device 204 may be a computing system such as a personal computer, a server, a workstation, a laptop computer, PDA, smart phone, and the like. Alternatively, host device 204 may be an electronic device such as a digital camera, a digital audio player, a digital video recorder, and the like.

In some aspects, storage medium 202 represents volatile memory used to temporarily store data and information used to manage data storage system 200. According to one aspect of the present disclosure, storage medium 202 is random access memory (RAM) such as double data rate (DDR) RAM. Other types of RAM also may be used to implement storage medium 202. Storage medium 202 may be implemented using a single RAM module or multiple RAM modules. While storage medium 202 is depicted as being distinct from controller 201, those skilled in the art will recognize that storage medium 202 may be incorporated into controller 201 without departing from the scope of the present disclosure. Alternatively, storage medium 202 may be a non-volatile memory such as a magnetic disk, flash memory, peripheral SSD, and the like.

As further depicted in FIG. 2, data storage system 200 may also include bus 250. The bus 250 may use suitable interfaces standard including, but not limited to, Serial Advanced Technology Attachment (SATA), Advanced Technology Attachment (ATA), Small Computer System Interface (SCSI), PC-extended (PCI-X), Fibre Channel, Serial Attached SCSI (SAS), Secure Digital (SD), Embedded Multi-Media Card (EMMC), Universal Flash Storage (UFS) and Peripheral Component Interconnect Express (PCIe).

Host device 210 and data storage system 200 may be in communication with each other via a wired or wireless connection and may be local to or remote from one another. According to some aspects, data storage system 200 may include pins (or a socket) to mate with a corresponding socket (or pins) on host device 210 to establish an electrical and physical connection. According to one or more other aspects, data storage system 200 includes a wireless transceiver to place host device 210 and data storage system 200 in wireless communication with each other.

Data storage system 200 may further include a host interface 260. Host interface 260 is configured to be coupled to host device 210, to receive data from and send data to host device 210. Host interface 260 may include both electrical and physical connections for operably coupling host device 210 to controller 201. Host interface 260 is configured to communicate data, addresses, and control signals between host device 210 and controller 201.

Flash device 203 represents a non-volatile memory device for storing data. According to one aspect of the present disclosure, flash device 203 includes, for example, a NAND flash memory. Flash device 203 may include a single flash memory device or chip, and may include multiple flash memory devices or chips arranged in multiple channels. Flash device 203 is not limited to any particular capacity or configuration. For example, the number of physical blocks, the number of physical pages per physical block, the number of sectors per physical page, and the size of the sectors may vary within the scope of the present disclosure.

Flash memory may have a standard interface specification. This standard ensures that chips from multiple manufacturers may be used interchangeably (at least to a large degree). The interface may further hide the inner working of the flash memory and return only internally detected bit values for data.

Figure 3:
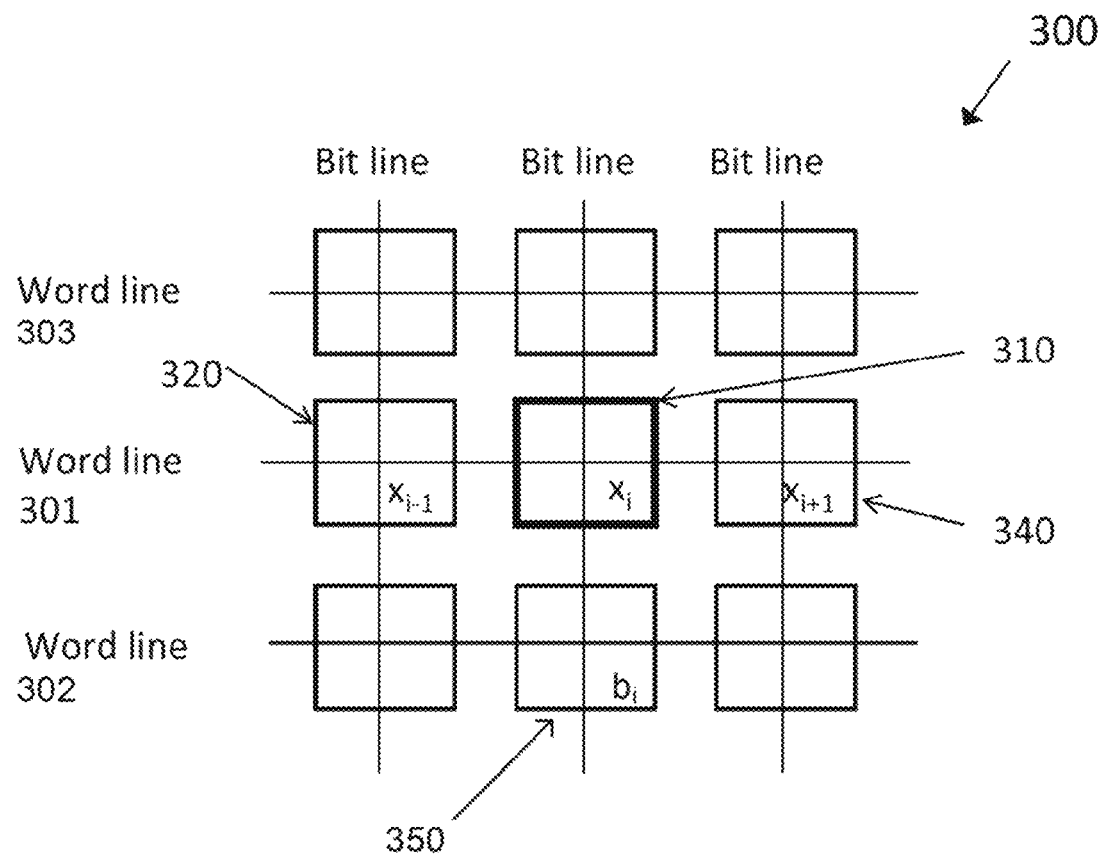
FIG. 3 depicts a portion of a memory array comprising memory cells of an example flash storage device.

FIG. 3 depicts a portion of a memory array 300 comprising memory cells of an example flash storage device in accordance with one or more implementations of the subject technology. Data stored in target memory cell 310 may be affected by the data stored in adjacent cells, for example, in word line 301 and in word line 302 positioned just below word line 301, and/or in word line 303 positioned just above word line 301. Adjacent cells may generate different inference signals depending on the type of data stored and the interference signals may cause voltage shifts in the target cell 310. The interference is called ICI and may be more damaging as the number of bits stored per cell increases or the cell density increases.

In various implementations, when target cell 310 is programmed, the data stored in target cell 310 may include an interference signal from the left adjacent cell 320 that stores data x(i−1). Similarly target cell 310 may also have another interference signal from the right adjacent cell 340 that stores data x(i+1). Target cell 310 may also have another interference signal from the bottom cell 350 on a lower adjacent word line that stores data $b_i$. These interference signals are introduced when these cells that are adjacent to target cell 310 are programmed, in that they may cause voltage shifts to the data stored x(i) in the target cell 310. ICI may further be affected by the data stored in target cell 310 and the type of data (e.g., cell data levels) stored in other neighboring cells.

Because ICI is not considered and/or mitigated in traditional devices, the decoding performance of those devices may be degraded. According to various aspects of the subject technology, ICI is determined for cells in the same word line of target cell 310 and in adjacent word lines. The effects of ICI from adjacent cells are better understood with reference to FIG. 5, described below.

Figure 4A:
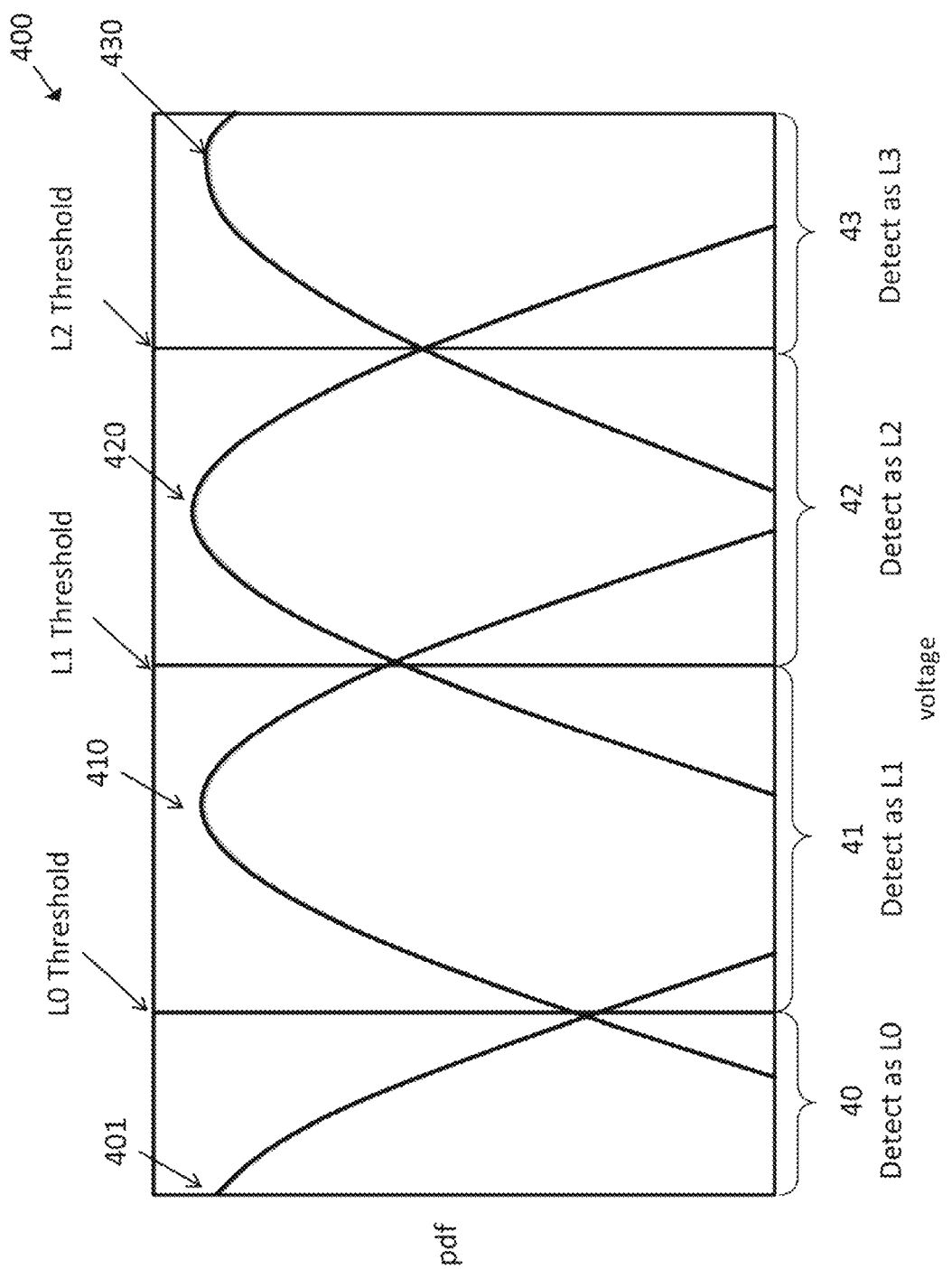
FIGS. 4A and 4B example probability density distribution curves for different cell data levels.

FIG. 4A depicts example probability density distribution curves 400 for L0, L1, L2, and L3 data levels, in accordance with one or more aspects of the present disclosure. In the example illustrated in FIG. 4A, each memory cell employs four possible data levels to store two bits of data. FIG. 4A illustrates four cell distributions 401, 410, 420, and 430 that are obtained from training data. The distributions 401, 410, 420, and 430 correspond to the probability density distribution curves for L0, L1, L2, and L3 data levels, respectively. Each data level is separated by a respective threshold voltage level. In the depicted example, the threshold voltage levels are identified as L0 threshold, L1 threshold, and L2 threshold. The threshold voltage levels are used by a threshold detector to determine, for example, if a read signal should be read as being in distribution 401, 410, 420, or 430.

Figure 4B:
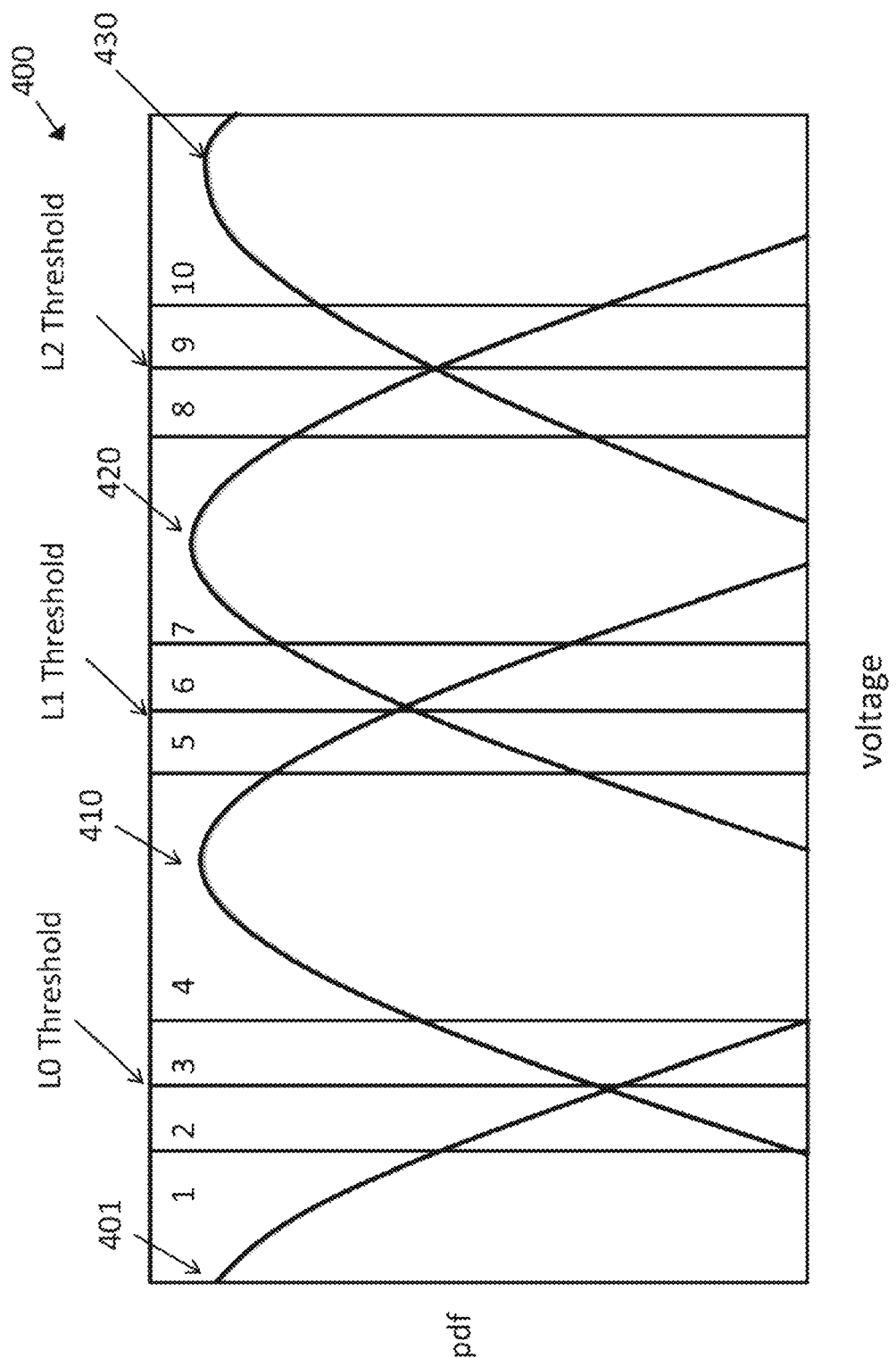

FIG. 4B depicts the example probability density distribution curves 400 for L0, L1, L2, and L3 data levels and multiple voltage threshold levels between each data level for determining the data levels. In the example illustrated in FIG. 4B, the voltage window is partitioned into ten bins 1-10. The number of bins is determined by the number of threshold voltage levels used by the threshold detector. In the depicted example, there are nine different threshold voltage levels, and the voltage window is therefore divided into 10 regions or bins.

Each threshold voltage level (L0 Threshold, L1 Threshold, and L3 Threshold) is a cross-over location at a respective boundary region. As depicted by FIG. 4B, additional threshold voltage levels around a respective threshold (e.g., L0 threshold) establish complimentary bins (e.g., bins 2 and 3) at border regions of each distribution near the respective threshold. For example, at the threshold level of the boundary region of L0/L1 (e.g., the L0 Threshold), there may be two additional threshold voltage levels that are slightly lower and higher than the optimal threshold level of L0/L1 boundary region. The foregoing threshold voltage levels (including, e.g., levels that establish complementary bins at border regions) may be determined by training data or based on data provided by flash manufacturers.

Figure 5:
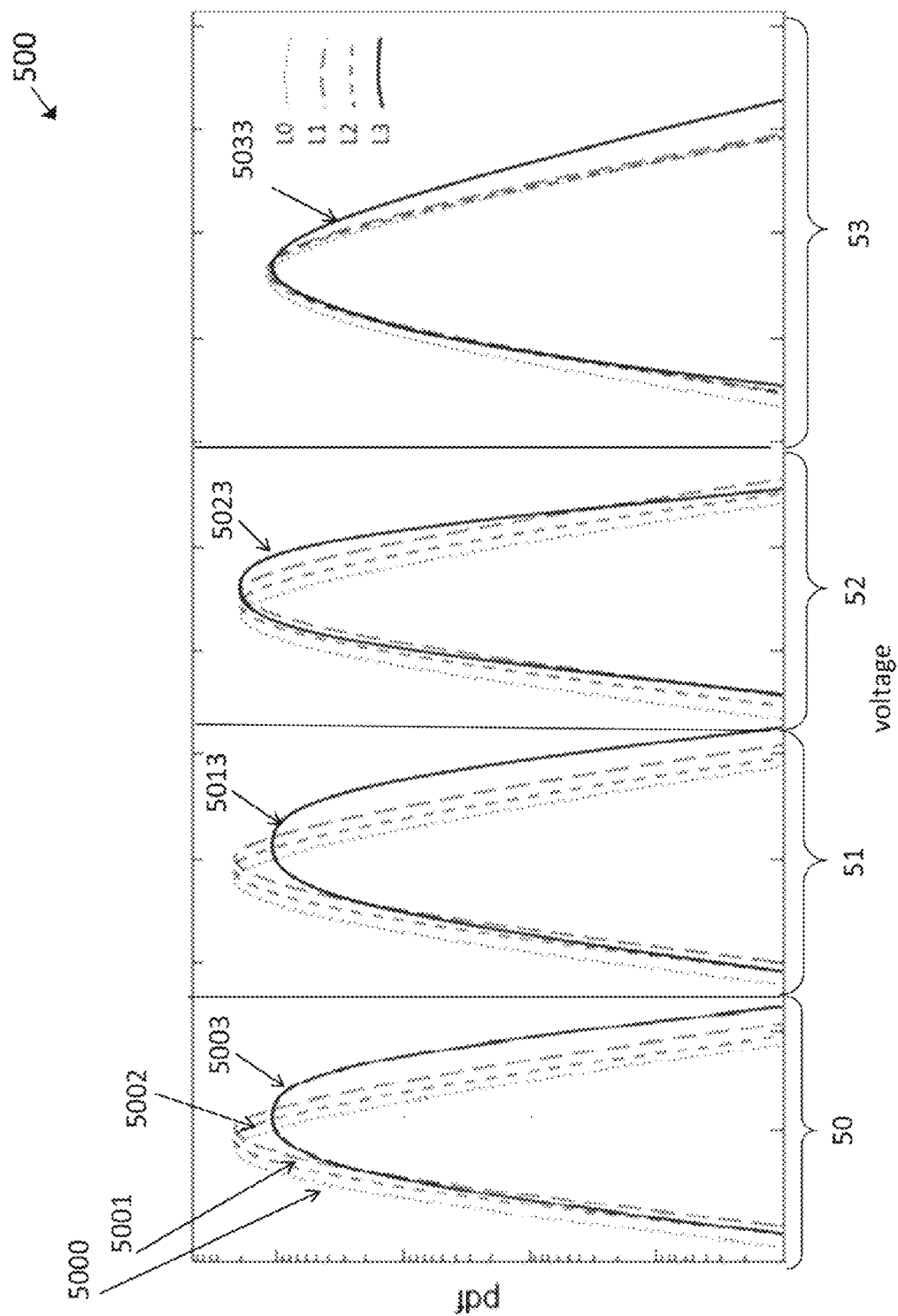
FIG. 5 depicts example group-based probability density distribution curves for different cell data levels.

FIG. 5 depicts example probability density distribution curves 500 for a given group of target cells when their adjacent cells are programmed at certain cell data levels in accordance with one or more aspects of the present disclosure. Specifically, FIG. 5 depicts different probability density distribution curves of certain cells when their left cells are programmed at L0, L1, L2, and L3, respectively. It may also be observed that the probability density distribution curves 5003, 5013, 5023, and 5033 for a group of reference cells are shifted to the right when their adjacent left cells are programmed at L3. Significant shifts in the voltage distributions are also observed when the right cells or when both left and right cells are programmed at L3.

In one or more implementations, the ICI of one or more adjacent cells (e.g., left adjacent cell 320, and/or bottom cell 350) is considered for the target cell 310. When one adjacent cell is considered, there are only 16 probability density distribution curves shown on FIG. 5. If two adjacent cells are considered, there are 64 probability density distribution curves. In short, the number of probability density distribution curves applicable to each possible data level of a given target cell is the number of possible data levels for each level raised to the number of adjacent cells that affect a given target cell.

In some implementations, each target cell 310 may have one of four possible data levels, there is one adjacent cell (left cell) per target cell 310 and each adjacent cell may have one of four possible levels. Thus, for illustration, there are sixteen ($16=4*4^1$) total probability density distribution curves. Four of which are for data level 0 (curves 5000-5003) attributable to four data levels (L0-L3) of the left cell. There are also four probability density distribution curves for each of the other data levels L1, L2 and L3. The number of group-based probability density distribution curves may be extended to multi-level flash devices having a different number of data levels per cell, eight for example, as well as other numbers of adjacent cells that may also cause inter-cell interference.

In some implementations, the group-based probability density distribution curves of FIG. 5 illustrate the ICI effects of the data stored on the left cell on a given target cell. While the effect of ICI on the probability density distribution curves is illustrated, the probability density distribution curves may express other distortions instead of ICI, or in addition to ICI. Distortions such as program disturb, read disturb, the age of the flash memory device, and/or additional noise may also be taken into consideration. Accordingly, the probability density distribution curves may be updated based on additional distortions and represented as a stored table and/or an expression.

In one or more implementations, the probability density distribution curves are dynamically updated based on the operating conditions. For example, the group-based probability density distribution curves as illustrated in FIG. 5 may further be based on the endurance or life of a flash device. At beginning of life of a flash device, a first group-based probability density distribution curves may be used to define a trellis. At the middle of life, a second group-based probability density distribution curves may be used. Similarly, at the end of life, a third group-based probability density distribution curves may be used. The selected probably density functions may be chosen based on a predetermined number of program/erase cycles, for example.

FIG. 6 depicts example percentage changes in the means and variances of certain example probability density distribution curves based on cell data levels of adjacent cells in accordance with one or more aspects of the present disclosure. Experimental results show that each memory cell under test may experience a significant ICI in the word line and/or bit line direction(s) from its immediate neighboring cells, namely left and right adjacent cells in the word line of the cell under test, and/or in adjacent word lines above and/or below the word line of the cell under test.

FIG. 6 demonstrates the changes in the mean and variance of a target cell when an adjacent cell is programmed at a certain level. Specifically, FIG. 6 shows shifts in the mean and variance values of L1 distribution of a group of target cells when the left cell of each of the target cells is programmed at L3, the right cell of each of the target cells is programmed at L3, and when both the left and the right cells of each of the target cells are programmed at L3. In some implementations, the mean values may shift from approximately 0.24% to approximately 20%, and more specifically from 8.13% to 18.78%. The degree of the mean shift may depend on various factors including types of flash devices, endurance and retention characteristics, and other related flash parameters. In certain implementations, the variance may also increase by approximately 33% due to the effects of interference from the cell data levels of adjacent cells. These changes may be mitigated when a multi-directional ICI detector (e.g., multi-directional ICI detector 140) is employed. That is, the changes in the mean values and variances are taken into account to produce a more accurate flash output for decoding. In some implementations, using the multi-directional ICI detector of the present disclosure, improvements may be seen as much as 20% in symbol error rates (SER).

As indicated above, each memory cell experiences an ICI effect from, for example, left and right adjacent cells in the word line of the cell, and/or in adjacent word lines above and/or below the word line of the cell. Therefore, to improve the detection performance, a flash channel model which considers the ICI from left and right cells and cells in adjacent word lines that share the same bit line may be implemented. Thus, the output of cell i may be represented as:

$$y(i)=f(x(i),x(i-1),x(i+1),b(i),n(i)) \quad \text{(Eq. 1)}$$

where the channel output y(i) is a function of the current cell data level x(i), the cell data level x(i−1) of the left cell, the cell data level x(i+1) of the right cell, the cell data level b(i) of the adjacent cell in an adjacent word line, and the read noise n(i). In order to rectify the non-causality of equation 1, a delay may be introduced. By introducing a delay into the channel output, the channel response becomes causal. In some aspects, a detection trellis with a memory length of two cells is used to detect the cell data level of cell i, as represented in equation 1.

Figure 7:
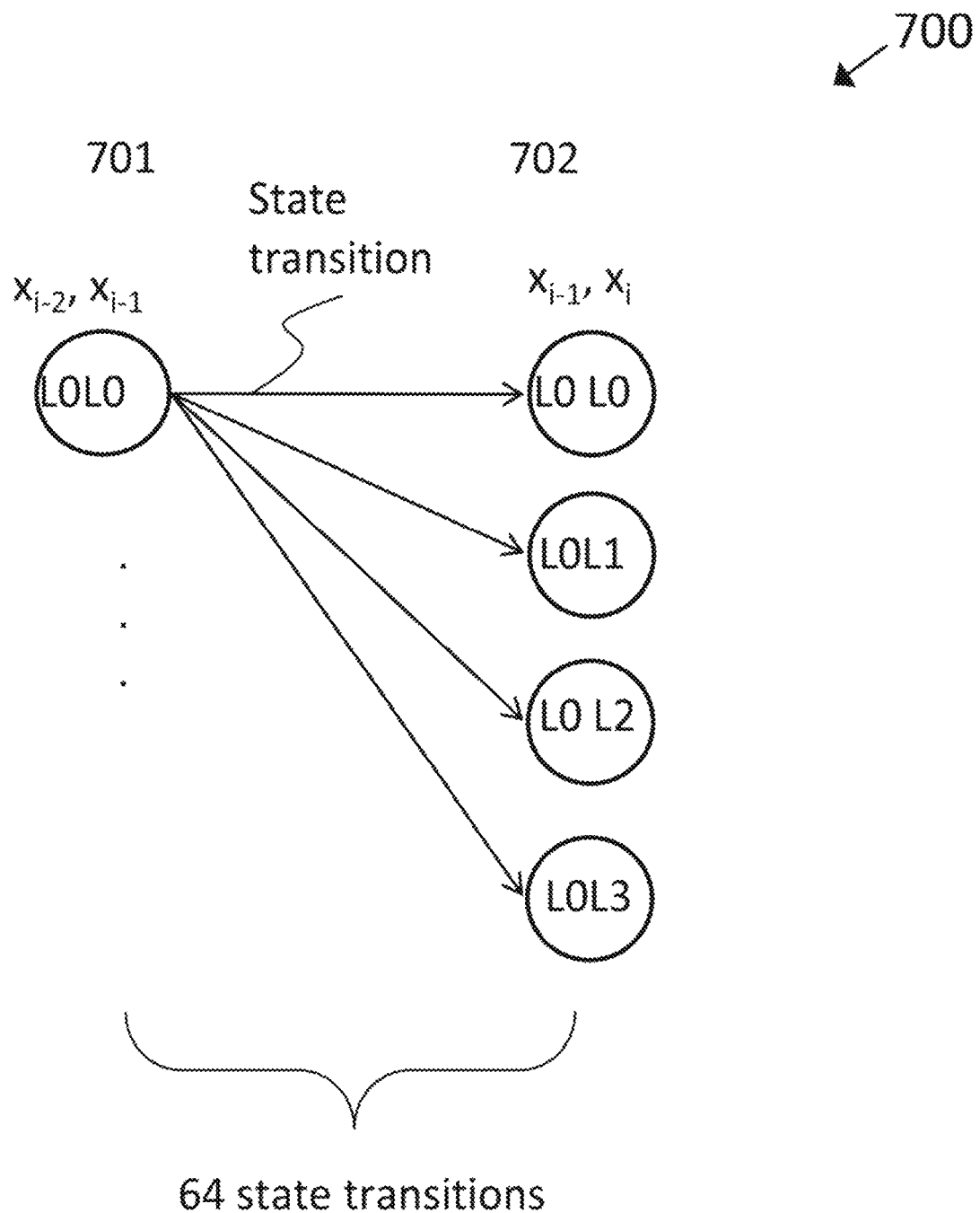
FIG. 7 is a partial schematic of a first example trellis used by an example multi-directional ICI detector.

FIG. 7 is a partial schematic of a first example trellis 700 used by an example multi-directional ICI detector (e.g., ICI detector 140) in accordance with one or more implementations of the subject technology. Trellis 700 includes various possible state transitions from one state to another. The number of states depends on the memory length of the flash channel. Each of the states is defined by the cell values in the memory of the flash channel. For example, the state at time index 701 is defined by the cell values x(i−1) and x(i). Similarly, the state at time index 702 is defined by the cell values x(i) and x(i+1).

In partial trellis 700, state transitions occur between certain states depending on the cell data levels in the flash channel memory. For example, a state transition occurs when the state at time index 701 (with cell data levels L0L0) changes to another state at time index 702 e.g., with cell data levels L0L1 or L0L2.

As illustrated, there are four possible state transitions from L0L0 at time index 701 to another state at time index 702. The state at time index 702 may have any of the four following data levels: L0L0, L0L1, L0L2, and L0L3. While only the initial state L0L0 at time index 701 is shown, there are sixteen different initial states at time index 701 (L0L0, L0L1, L0L2, L0L3, L1 L0, L1L1 . . . L3L3) because the flash channel has a memory length of two cells and each cell could have any of the four data levels. Thus, the total number of state transitions from one state to another is 64 since there are four transitions from one state to another. Each state transition has the information to generate the likelihoods for each read signal. Detection algorithms such as the BCJR or SOVA are then run on the trellis to detect a data sequence.

As will be described further, the probability of a particular state transition being a chosen path may be determined based on the value of a cell in an adjacent word line. For example, the probability may be based on data $b_i$ of bottom cell 350. Accordingly, data $b_i$ of bottom cell 350 may be presumed to be valid before data $b_i$ is used in a corresponding trellis equation. In this regard, word line 302 which includes bottom cell 350 may have been fully decoded prior to decoding of word line 301.

Referring back to FIG. 4A, in threshold detection, each of the distribution curves 401, 410, 420, and 430 represent the probability density distribution curves for data levels L0, L1, L2, and L3, respectively. When a cell has a read signal that falls within region 41, the cell may be interpreted by a threshold detector (e.g., after decoding) to have a data level of L1. Likewise, when a cell has a read signal that falls within region 42 the cell may be interpreted by the threshold detector to have a data level of L2. When a cell has a read signal that falls within region 43 the cell may be interpreted to have a data level of L3. If a cell has a read signal that falls within region 40 the cell may be interpreted as a L0 data level. The L0 detected cell is in an erased state and may store the encoded bit "11," whereas cells having data levels of L1, L2, and L3 may store the encoded bits "10", "00", and "01", respectively.

More accurate read outputs may be attained by obtaining soft information. In one or more implementations, soft information is obtained by reading the memory cells multiple times (e.g., 3 reads) around each boundary region to categorize the cells into bins, as shown in FIG. 4B. In some implementations, the probability of a cell being in a certain bin for each level may be computed from training data. According to the subject technology, bin information obtained from flash outputs, or conditional probabilities corresponding to the flash output, may be fed into a multi-directional ICI detector. The BCJR algorithm (which computes, e.g., the APP of each data level) is then utilized by the detector and optimal symbol detection carried out by outputting the symbol level having the largest APP.

In certain aspects, the multi-directional ICI detector of the subject technology offers better results than traditional threshold voltage sensing techniques. In traditional threshold detection techniques, sensing operations depend on the threshold detection levels for each level as shown in FIG. 4A. The threshold detection operation therefore depends heavily on the thresholds, which are the cross-over locations of between two adjacent probability density function distributions. The thresholds are obtained using training data. In some instances, the thresholds may shift by a certain value due to variations from one flash device to another, from one die to another, from one block to another block, different firmware settings, and even as a flash device ages, etc. When these shifts are not estimated or obtained correctly, an offset in the read may occur.

Figure 8:
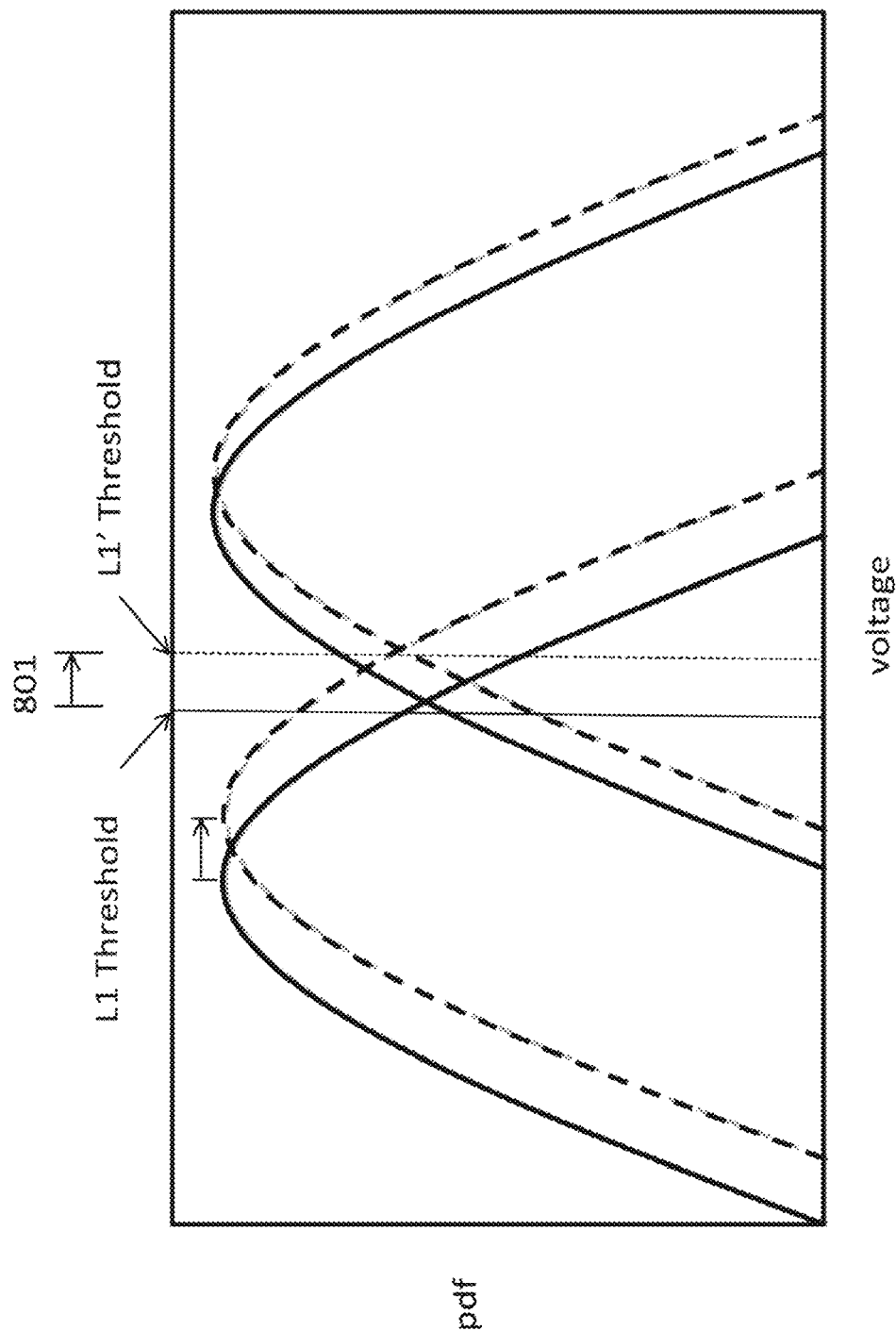
FIG. 8 depicts example probability density distribution curves with a read with certain offsets.

FIG. 8 depicts example probability density distribution curves with a read with certain offsets in accordance with certain aspects of the present disclosure. In the depicted example, an offset 801 (from the solid line to the new dash line) is observed when the crossover location of the distributions L1 and L2 is different than the actual read. The offsets may be in both directions. The offsets affect the symbol error rates (SER). Thus, in certain aspects, the multi-directional ICI detector may significantly improve the SER in the presence of any offsets.

Figure 9B:
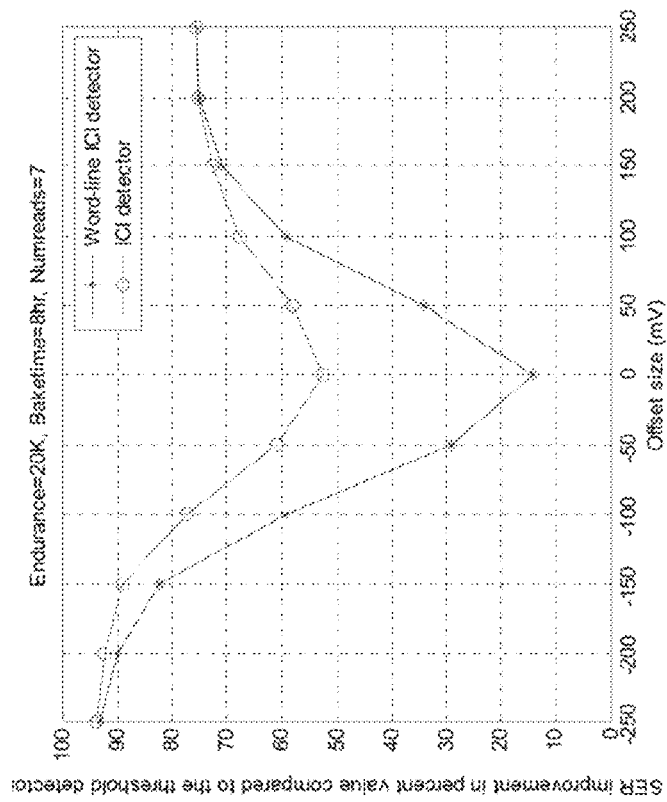
FIG. 9B depicts an example SER improvement in percent value for an example multi-directional ICI detector as compared to an example threshold detector.
Figure 9A:
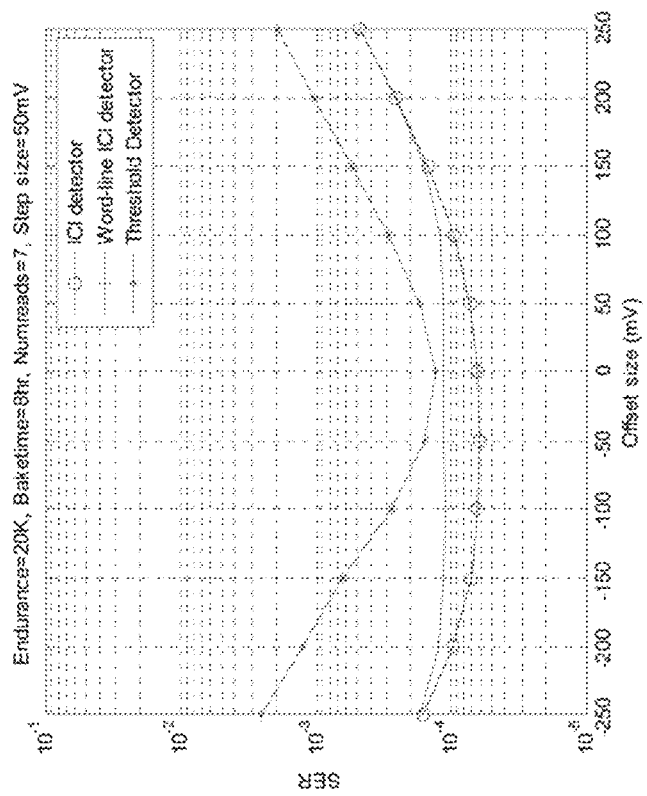
FIG. 9A depicts an example comparison of an example multi-directional ICI detector and an example threshold detector with regard to symbol error rate (SER) versus offset size (mV).

FIG. 9A depicts an example comparison of an example multi-directional ICI detector and an example threshold detector with regard to symbol error rate (SER) versus offset size (mV) in accordance with one or more aspects of the present disclosure. For example, FIG. 9A depicts SERs for a 50 mV step size and 7 reads on 20K cycled blocks with 8 hours of retention at 75 C degrees. The depicted simulation results show that the multi-directional ICI detector improves the SER compared to a threshold detection method in the presence or absence of offset.

FIG. 9B depicts an example SER improvement in percent value for an example multi-directional ICI detector as compared to an example threshold detector. The depicted simulation results illustrate that, in the absence of an offset, there is an approximate 15% improvement with a multi-directional ICI detector in SER compared to a threshold detector. This performance improvement of the multi-directional ICI detector in SER is shown to increase with increasing offset values.

FIG. 10 depicts example memory cell distributions and memory cell bin locations for reading an example SLC memory cell in accordance with one or more aspects of the present disclosure. Similar to FIG. 4B, soft information may be obtained by reading the memory cell multiple times (e.g., 3 reads) around the boundary region between what is expected to be a coded bit 1 and a coded bit 0. Accordingly, the expected distributions of the SLC memory cell may be categorized into bins (similar to that shown in FIG. 4B) as bins 1, 2, 3, and 4.

Figure 11:
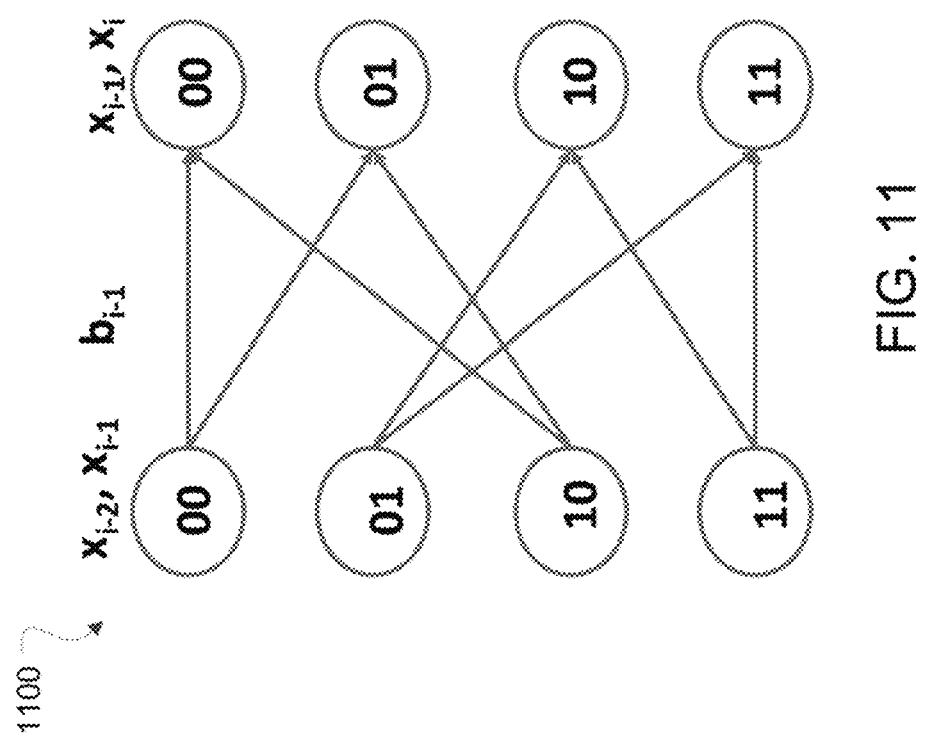
FIG. 11 depicts a partial schematic of a second example trellis used by a trellis-based algorithm for decoding SLC memory cells.

FIG. 11 depicts a partial schematic of a second example trellis 1100 used by a trellis-based algorithm for decoding SLC memory cells. Example trellis 1100 is provided in conjunction with the example memory cell distributions and cell bin locations of FIG. 10 to provide a basis for various examples below. These examples make reference to SLC memory cells for brevity; however the same concepts explained herein with respect to SLC memory may be applied to MLC memory cells and/or the example partial trellis described with respect to FIG. 7.

With regard to an SLC flash there may be two distributions; one distribution for coded bit of 1 and one distribution for coded bit of 0. As described previously. ICI information may be obtained for one or more word lines in connection with a read operation, and the ICI information used in a trellis-based algorithm. With brief reference to FIG. 3, ICI information used in the trellis-based algorithm may be based on a cell data level $x(i)$ of target cell 310, cell data level $x(i-1)$ of left adjacent cell 320, cell data level $x(i+1)$ of right adjacent cell 340, cell data level $b(i)$ of the bottom cell 350, and read noise $n(i)$.

With reference to trellis 1100, since each SIC memory cell may have only two levels there may be four different states at each time, represented by $\{x(i-1), x(i)\}$ (e.g., the initial state), and $\{x(i), x(i+1)\}$. Accordingly there are four possibilities for cells $\{x(i-1), x(i)\}$ which are shown as $\{00, 01, 10, 11\}$, and two possible state transitions for each possible state transition to $\{x(i), x(i+1)\}$, providing eight different state transition possibilities.

By generating trellis 1100 and providing all possible state transitions, all possible sequences that may be written on a page may be represented, and thus considered in the detection process. Additionally, the probability of each respective state transition may also be considered. Accordingly, example trellis 1100 has four different states at each time index i and eight state transitions from time index i to time index i+1 which are determined by state transition probabilities:

$$p(x(i),x(i+1)|x(i-1),x(i)) \quad \text{(Eq. 2)}$$

An example SLC page may be read using three read levels, to generate cell data levels for a flash channel that may each be categorized into four different bins: bin 1, bin 2, bin 3, bin 4. Accordingly, a BCJR algorithm may be used to produce soft information for use in decoding the flash channel. Inputs for the algorithm may be, for example, initial and end state conditions for an associated trellis, state transition probabilities, channel output probabilities, and the individual cell data levels as they are classified by bin.

Outputs for the algorithm may be, for example, a posteriori probabilities (APP), approximate APPs, LLRs, and/or hard decisions based on APPs and/or approximate APPs. Other algorithms such as SOVA or Max-log-MAP may also be used, utilizing, for example, the same inputs and channel representation. A BCJR algorithm may provide APPs, while SOVA may, for example, provide approximate APPs. LLRs may be obtained and/or hard decisions made from APPs and approximate APPs.

A state transition probability provides a probability that the next cell will be a certain value. For example, given $x(i-1)$ and $x(i)$, a state transition probability may be determined for each possible sequence $(x(i), x(i+1))$ for each given value of $x(i+1)$.

A lookup table may be provided to store state transition probabilities. Tables 1 and 2, below, depict example lookup tables for storing example predetermined probabilities for the possible state transitions of a three read memory channel output in an SLC device.

TABLE 1

Example State Transition Probabilities for b(i) = 1

| State transition | Corresponding probability distributions for $\gamma_i$ with 3 reads | | | |
|---|---|---|---|---|
| $x_{i-1}x_i, x_i x_{i+1}$ | Bin 1 | Bin 2 | Bin 3 | Bin 4 |
| 00, 00 | 0.03 | 0.04 | 0.05 | 0.88 |
| 00, 01 | 0.04 | 0.05 | 0.06 | 0.85 |
| 01, 10 | 0.84 | 0.09 | 0.04 | 0.03 |
| 01, 11 | 0.9 | 0.07 | 0.02 | 0.01 |
| 10, 00 | 0.02 | 0.03 | 0.05 | 0.9 |
| 10, 01 | 0.03 | 0.04 | 0.06 | 0.87 |
| 11, 10 | 0.82 | 0.09 | 0.06 | 0.03 |
| 11, 11 | 0.85 | 0.08 | 0.04 | 0.03 |

TABLE 2

Example State Transition Probabilities for b(i) = 0

| State transition | Corresponding probability distributions for $\gamma_i$ with 3 reads | | | |
|---|---|---|---|---|
| $x_{i-1}x_i, x_i x_{i+1}$ | Bin 1 | Bin 2 | Bin 3 | Bin 4 |
| 00, 00 | 0.01 | 0.03 | 0.06 | 0.9 |
| 00, 01 | 0.02 | 0.03 | 0.07 | 0.88 |
| 01, 10 | 0.82 | 0.08 | 0.06 | 0.04 |
| 01, 11 | 0.88 | 0.05 | 0.04 | 0.03 |
| 10, 00 | 0.01 | 0.02 | 0.06 | 0.91 |
| 10, 01 | 0.01 | 0.03 | 0.07 | 0.89 |
| 11, 10 | 0.79 | 0.08 | 0.07 | 0.06 |
| 11, 11 | 0.82 | 0.08 | 0.06 | 0.04 |

As shown by Tables 1 and 2, all state transition probabilities stemming from any input sequence $\{x(i-1), x(i)\}$ add up to 1. The symbolic representation of the conditional probability for any given cell may be shown as:

$$p(y(i)|x(i-1),x(i),x(i+1),b(i)=1) \quad \text{(Eq. 3)}$$

wherein the probability of $y(i)$, given the values of $x(i-1)$, $x(i)$, $x(i+1)$ and $b(i)$ equals 1. In an ideal example, for example in the case of SLC where there are only two possible outcomes, the probability of a state transition from 00 to 00, or the probability of a state transition from 00 to 01, is 0.5. Additionally, there may be no constraint on any particular input sequence, so that each input sequence is equally likely.

With reference to equation 3, y(i) is representative of observed raw cell data level of a target cell 310. Cell data levels x(i−1), x(i), and x(i+1) may be representative of all possible channel input levels of left adjacent cell 320, target cell 310, and right adjacent cell 340 for the cell data level, and data value bi is representative of an actual decoded level of bottom cell 350 corresponding to target cell 310. If the input levels of left adjacent cell 320, target cell 310, right adjacent cell 340 are assumed, and the level of bottom cell 310 is known then the probability of y(i) can be determined.

The probabilities stored in the lookup table may be arranged according to bin number. In this manner, once the bin number for a target cell 310 is known (e.g., based on a read of the cell) the lookup table may provide the probability that the target cell 310 should be the bin that was indeed read. In example Table 1, if a read of target cell 310 produces a value in bin 3 then, given a state transition from 00 to 00, the probability of target cell actually being in bin 3 is 0.05, or 5%. If the read of target cell 310 produces a value in bin 4 then, for the same state transition, the probability of target cell 310 being in bin 4 is 0.88, or 88%. Accordingly, the lookup table provides corresponding probability distributions for the channel outputs, for given channel inputs, and thus provides the probability that a threshold voltage read by controller 201 in a particular range or a particular location.

A different lookup table may be generated and/or stored for each possible value of a memory cell an adjacent word line to the target cell that is adjacent to the target cell. In this manner, with reference to FIG. 3, a lookup table may be chosen depending on the value of a bottom cell 350. For an SLC application, two lookup tables would be stored; a first lookup table for utilization when bottom cell 350 is a 1 (e.g., Table 1), and a second lookup table for utilization when bottom cell 350 is a 0 (e.g., Table 2). Similarly, four lookup tables may be utilized in an MLC application to accommodate levels L0, L1, L2, and L3 (see FIG. 4A). In some implementations, a single set of lookup tables may be generated for all cells and all word lines. However, a set of lookup tables may be generated and/or stored for utilization based on word line location, bit line location, block location, or memory cell location.

Figure 12:
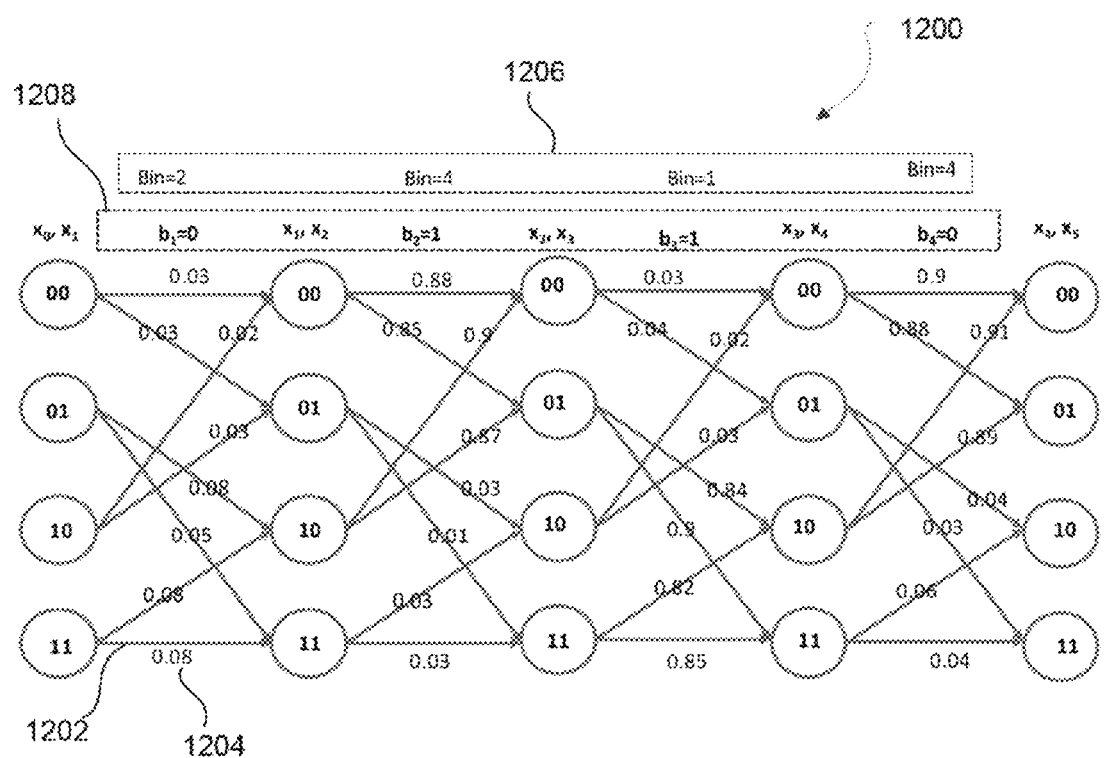
FIG. 12 depicts an example trellis for use in a BCJR algorithm, including state transitions and state transition probabilities for cells in a first word line that are dynamically populated based on the decoded values of corresponding adjacent cells in a second, adjacent word line.

FIG. 12 depicts an example trellis 1200 for use in a BCJR algorithm, including state transitions 1202 and state transition probabilities 1204 for cells in a first word line that are dynamically populated based on the decoded values of corresponding adjacent cells in a second, adjacent word line. Example trellis 1200 is based on SLC memory cells for brevity, however the same concept may be applied to MLC memory cells or other configurations in which a trellis is used to determine a posteriori probabilities (APPs), log-likelihood ratios (LLRs), or approximation of LLRs or APPs.

Trellis 1200 may be constructed based on a length of a word line. In this regard, the number of state transitions 1202 will be commensurate with or equal to the number of cells in the word line. In the depicted example, a partial word line of four memory cells are read and the read values used to generate state transition probabilities within the trellis. The first line 1206 depicts an example in which each of the four cells is read as being in bin 2, bin 4, bin 1, and bin 4, respectively. With brief reference to FIG. 3, the second line 1208 depicts the bin values for bottom cell 350 for each corresponding target cell 310 in first line 1206. According to various aspects of the subject technology, the value of each bottom cell 350 is presumed to be fixed and/or accurate, for example, having been accurately decoded by a prior read operation. The trellis-based algorithm (e.g., BCJR algorithm) uses the trellis to determine, for example, APPs for determining each target cell 310 along the word line being read.

Each state transition probability 1204 is determined based on the read value of a corresponding bottom cell 350. Where there are two possible values for bottom cell 350 the subject technology may provide two respective lookup tables (based on, e.g., Table 1 and Table 2, above). A respective lookup table is selected based on the read value for bottom cell 350, and a probability value for the state transition selected from the selected lookup table based on an indexing of transitions within the selected lookup table. In the depicted example, the lookup table of Table 1 is associated with a bottom cell 350 having a value of "1" (or in bin 1), and the lookup table of Table 2 is associated with a bottom cell 350 having a value of "0" (or in bin 0). The first target cell of the word line is read to be in bin 2, and the value of the corresponding bottom cell is determined to have a value of 0 (e.g., in bin 0). Accordingly, the table of Table 2 is selected and indexed by bin 2 (the value of the first target cell) to retrieve the probabilities for each respective state transition of the trellis. For example, a probability of 0.03 is provided by indexing the lookup table by bin 2 and the transition from 00 to 00.

The trellis-based algorithm of the subject technology uses the inputs as provided by the predetermined lookup tables to generate a posteriori probabilities for each cell, the probabilities being for use by decoder 160 of FIG. 1 in the decoding of the memory cells in a word line. As an example, outputs computed by a BCJR algorithm using a similar trellis for four memory cells may be similar to the outputs presented below in Table 3.

TABLE 3

Example Probability Outputs of an Example Trellis-Based Algorithm

| | Cell 1 | Cell 2 | Cell 3 | Cell 4 |
|---|---|---|---|---|
| A posteriori probability of coded bit 1 | 0.81 | 0.03 | 0.95 | 0.04 |
| A posteriori probability of coded bit 0 | 0.19 | 0.97 | 0.05 | 0.96 |

The examples in Table 3 are merely representative of a posteriori probabilities that may be computed by a BCJR algorithm, and are not actual outputs of such an algorithm.

Figure 13:
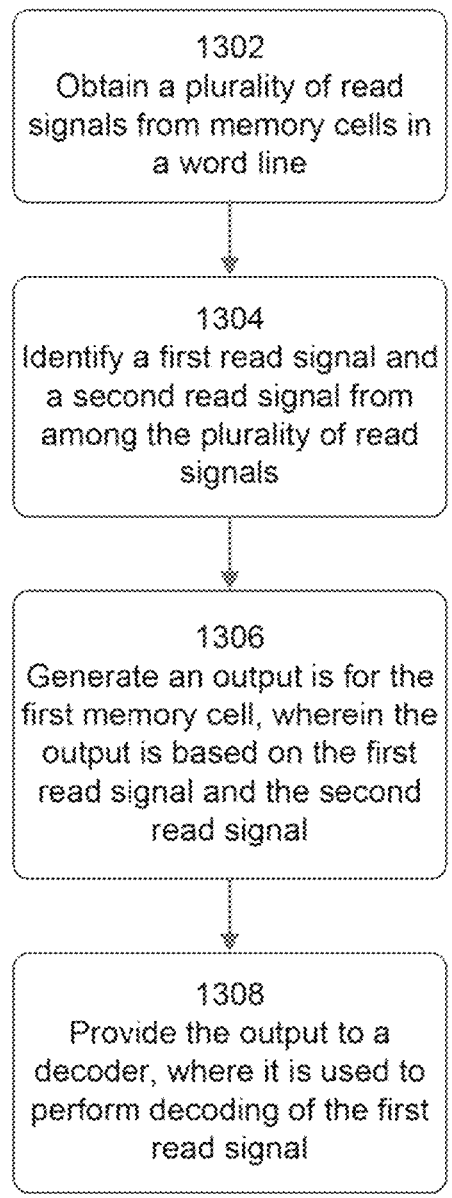
FIG. 13 depicts a flow diagram of an example process for generating a decoder input.

FIG. 13 depicts a flow diagram of an example process 1300 for generating a decoder input according to various aspects of the subject technology. For explanatory purposes, the various blocks of example process 1300 are described herein with reference to the components and/or processes described herein. The one or more of the blocks of process 1300 may be implemented, for example, by one or more processors, including, for example, controller 201 or one or more components or processors of controller 201. In some implementations, one or more of the blocks may be implemented apart from other blocks, and by one or more different processors or controllers. Further for explanatory purposes, the blocks of example process 1300 are described as occurring in serial, or linearly. However, multiple blocks of example process 1300 may occur in parallel. In addition, the blocks of example process 1300 need not be performed in the order shown and/or one or more of the blocks of example process 1300 need not be performed.

In the depicted example, a plurality of read signals from memory cells in a word line are obtained (1302), for example, by reading the memory cells. In certain aspects, the cells in a respective word line may be read together by controller 201. The read signals may provide an indication as to the data that is stored (e.g., encoded) in one or more cells in the word line. By way of example, the read signals may indicate a programming level corresponding to one or more cells in the word line.

A first read signal and a second read signal are identified, from among the plurality of read signals (1304). According to the subject technology, the first read signal may be associated with a first memory cell in a first word line and the second read signal may be associated with a second memory cell in a second word line. Depending on the implementation, the second word line may be above or below the first word line, and the second memory cell may be in the same bit line as the first memory cell. Additionally or in the alternative, the second word line may be adjacent to the first word line. The second word line may have been previously read and decoded prior to reading the first word line.

An output is subsequently generated for the first memory cell, wherein the output is based on the first read signal and the second read signal (1306). The output may be generated, for example, based on a trellis-based algorithm. In this regard, one or more input values may be determined based on the second read signal, provided to the trellis-based algorithm, wherein the output is based on the provided input values. In one or more implementations, the trellis-based algorithm may reference a trellis comprising a plurality of state transitions, with each state transition representative of a transition of memory cell output values that are read sequentially along a word line, and each transition being associated with a respective one of the input values.

Each of the foregoing input values may be retrieved from one or more lookup tables based on an indexing of the one or more lookup tables by a first value corresponding to the first read signal and a second value corresponding to the second read signal. The first value may be, for example, one of a predetermined number of bins associated with a predetermined density distribution curve associated with the first memory cell. The second value may be, for example, a decoded value of the second memory cell. In some implementations, the second value may be a bin to which the second memory cell is assigned. Accordingly, the trellis-based algorithm may produce one or more of a log-likelihood ratio (LLR) and an a posteriori probability (APP) for use by a decoder.

The output is provided to a decoder (e.g., a LDPC decoder), where it is used to perform decoding of the first read signal (1308). In this manner, the second read signal may be used to facilitate decoding of information that is stored in the first memory cell.

In some implementations, a third read signal associated with a third memory cell may also be identified from among the plurality of read signals. In this regard, the third memory cell may be in the first word line and adjacent to the first memory cell, and the output may be further based on the third read signal associated with the third memory cell. In this regard, the output may be based on inter-cell interference data corresponding with a prior programming of the second and third memory cells. Moreover, one or more additional signals associated with a fourth and/or fifth, and/or other memory cells within the word line may be identified and used generate an output for the first memory cell in the manner previously described. These additional signals may be from cells that are in the same word line as the first memory cell. For example, third and fourth memory cells may be adjacent to the first memory cells but on opposite sides. In another example, one or more memory cells may be in the same word line as first memory cell but not immediately adjacent to the first memory cell.

In some implementations, pages of memory may be interleaved on one or more word lines. For example, with reference to FIG. 3, left adjacent cell 320 may be in a different page than target cell 310. Accordingly, signals from cells in a first page of an interleaved word line may be identified and used to generate the previously described output for one or more memory cells in a second page, to mitigate the effects of ICI from the cells in the first page.

In certain aspects, the subject technology may include the implementation of different blocks or steps that those discussed above with respect to example process 1200. For example, the subject technology may be realized as a method for mitigating the effects of ICI on a flash output that is used for decoding in an electronic device, and specifically in a flash memory device.

Many of the above-described features of example process 1200 and related features and applications, may be implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

The term "software" is meant to include, where appropriate, firmware residing in read-only memory or applications stored in magnetic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

It is understood that illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the present disclosure.

It is understood that the specific order or hierarchy of steps in the processes disclosed is presented as an illustration of some exemplary approaches. Based upon design preferences and/or other considerations, it is understood that the specific order or hierarchy of steps in the processes may be rearranged. For example, in some implementations some of the steps may be performed simultaneously. Thus the accompanying method claims present elements of the various steps in a sample order, and are not meant to be limited to the specific order or hierarchy presented.

The previous description is provided to enable any person skilled in the art to practice the various aspects described herein. The previous description provides various examples of the present disclosure, and the present disclosure is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

The phrases "in communication with" and "coupled" mean in direct communication with or in indirect communication with via one or more components named or unnamed herein (e.g., a memory card reader)

A phrase such as an "aspect" does not imply that such aspect is essential to the present disclosure or that such aspect applies to all configurations of the present disclosure. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the present disclosure or that such embodiment applies to all configurations of the present disclosure. A disclosure relating to an implementation may apply to all aspects, or one or more aspects. An implementation may provide one or more examples. A phrase such as an "embodiment" may refer to one or more implementations and vice versa. A phrase such as a "configuration" does not imply that such configuration is essential to the present disclosure or that such configuration applies to all configurations of the present disclosure. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A method for retrieving information stored in flash memory, comprising:
   obtaining a plurality of read signals from a plurality of memory cells;
   identifying, from among the plurality of read signals, a first read signal associated with a first memory cell in a first word line and a second read signal associated with a second memory cell in a second word line, wherein the second word line is adjacent to the first word line; and
   generating an output for the first memory cell, wherein the output is based on the first and the second read signals.

2. The method of claim 1, further comprising:
   decoding the first read signal based on the output.

3. The method of claim 1, wherein the output is generated based on a trellis-based algorithm, the method further comprising:
   determining one or more input values based on the second read signal; and
   providing the determined one or more input values to the trellis-based algorithm, wherein the output is based on the provided input values.

4. The method of claim 3, wherein the trellis-based algorithm references a trellis comprising a plurality of state transitions, each state transition representative of a transition of memory cell data levels that are read sequentially along the first word line, and each transition being associated with a respective one of the input values.

5. The method of claim 4, wherein each of the input values is retrieved from one or more lookup tables based on an indexing of the one or more lookup tables by a first data level corresponding to the first read signal and a second data level corresponding to the second read signal.

6. The method of claim 5 wherein the first read signal is one of a predetermined number of bins associated with a predetermined density distribution curve associated with the first memory cell.

7. The method of claim 4, wherein the trellis-based algorithm produces a log-likelihood ratio (LLR) or a posteriori probability (APP) for use by a decoder.

8. The method of claim 1, further comprising:
   identifying, from among the plurality of read signals, a third read signal associated with a third memory cell, the third memory cell being in the first word line and adjacent to the first memory cell, wherein the output is further based on the third read signal associated with the third memory cell.

9. The method of claim 8, wherein the output is based on inter-cell interference data corresponding with a prior programming of the second and third memory cells.

10. The method of claim 1, wherein the second word line is decoded before the first word line and the second read signal is a cell data level that is presumed to be valid.

11. A data storage system, comprising:
a decoder;
a plurality of memory cells; and
a controller coupled to the configuration memory and the plurality of memory cells, wherein the controller is configured to:
obtain a plurality of read signals from the plurality of memory cells;
identify, from among the plurality of read signals, a first read signal associated with a first memory cell in a first word line and a second read signal associated with a second memory cell in a second word line, wherein the second word line is adjacent to the first word line; and
generate an output for the first memory cell, wherein the output is based on the first and the second read signals.

12. The data storage system of claim 11, wherein the controller is further configured to:
provide the output to the decoder; and
receive from the decoder, a decoded value for the first memory cell based on the output.

13. The data storage system of claim 11, wherein the controller is further configured to:
generate the output based on a trellis-based algorithm;
determine one or more input values based on the second read signal; and
provide the determined one or more input values to the trellis-based algorithm, wherein the output is based on the provided input values.

14. The data storage system of claim 13, wherein the trellis-based algorithm references a trellis comprising a plurality of state transitions, each state transition representative of a transition of memory cell data levels that are read sequentially along the first word line, and each transition being associated with a respective one of the input values.

15. The data storage system of claim 14, wherein each of the input values is retrieved from one or more lookup tables based on an indexing of the one or more lookup tables by a first value corresponding to the first read signal and a second value corresponding to the second read signal.

16. The data storage system of claim 15 wherein the first read signal is one of a predetermined number of bins associated with a predetermined density distribution curve associated with the first memory cell.

17. The data storage system of claim 14, wherein the trellis-based algorithm produces a log-likelihood ratio (LLR) or a posteriori probability (APP) for use by the decoder.

18. The data storage system of claim 11, wherein the controller is further configured to:
identify, from among the plurality of read signals, a third read signal associated with a third memory cell, the third memory cell being in the first word line and adjacent to the first memory cell, wherein the output is further based on the third read signal associated with the third memory cell.

19. A computer program product tangibly embodied in a computer-readable storage device and comprising instructions that, when executed by a memory controller, cause the memory controller to:
obtain a plurality of read signals from a plurality of memory cells;
identify, from among the plurality of read signals, a first read signal associated with a first memory cell in a first word line, a second read signal associated with a second memory cell in a second word line, and a third read signal associated with a third memory cell, the third memory cell being in the first word line and adjacent to the first memory cell, the second memory cell being in the same bit line as the first memory cell, and the second word line is adjacent to the first word line; and
generate an output for the first memory cell, wherein the output is based on the first and the second and third read signals.

20. The computer program product of claim 19, wherein the output is generated based on a trellis-based algorithm, wherein the instructions, when executed by the memory controller, further cause the memory controller to:
retrieve one or more input values from one or more lookup tables based on an indexing of the one or more lookup tables by a first value corresponding to the first read signal and a second value corresponding to the second read signal; and
provide the one or more input values to the trellis-based algorithm, wherein the output is based on the provided input values,
wherein the trellis-based algorithm references a trellis comprising a plurality of state transitions, each state transition representative of a transition of memory cell data levels that are read sequentially along a word line, and each transition being associated with a respective one of the input values.

* * * * *